United States Patent [19]
Uenaka et al.

[11] Patent Number: 5,173,841
[45] Date of Patent: Dec. 22, 1992

[54] SEMICONDUCTOR DEVICE CARD AND METHOD OF MANUFACTURING THE SAME

[75] Inventors: Takeshi Uenaka, Sanda; Jun Ohbuchi, Itami; Hajime Maeda, Itami; Toru Tachikawa, Itami; Shigeo Onoda, Itami, all of Japan

[73] Assignee: Mitsubishi Denki Kabushiki Kaisha, Japan

[21] Appl. No.: 674,167

[22] Filed: Mar. 25, 1991

[30] Foreign Application Priority Data

Mar. 26, 1990 [JP] Japan ............................ 2-78294

[51] Int. Cl.⁵ ............................................ H05K 5/00
[52] U.S. Cl. .................................. 361/399; 235/492; 361/395
[58] Field of Search .......... 174/138 E, 138 G, 140 R, 174/146, 166 S, 158 R, 161 R, 163 R; 235/487, 488, 490, 492; 364/705.1, 708; 361/392, 95, 399, 419, 420; 248/611, 612, 615, 627, 644

[56] References Cited

U.S. PATENT DOCUMENTS 4,905,124 2/1990 Banjo et al. ...................... 361/395

FOREIGN PATENT DOCUMENTS 0179322 7/1988 Japan ................................. 361/419

Primary Examiner—Leo P. Picard
Assistant Examiner—Donald A. Sparks
Attorney, Agent, or Firm—Leydig, Voit & Mayer

[57] ABSTRACT

A semiconductor device card and a method of manufacturing the card. A frame includes an integral spacer which fills a dead space on a circuit board to eliminate the need for positioning a separate spacer in the dead space on the circuit board and fixing the spacer in place with a bonding sheet or the like. In a semiconductor device card in which a spacer for filling a dead space on the circuit board is bonded to a corresponding panel, a recess is formed on the surface of the spacer bonded to the obverse or reverse panel to reduce undulations occurring in the panel surface.

7 Claims, 5 Drawing Sheets

SEMICONDUCTOR DEVICE CARD AND METHOD OF MANUFACTURING THE SAME

BACKGROUND OF THE INVENTION

This invention relates to a semiconductor device card and, more particularly, to an outer casing assembly structure of a semiconductor device card.

FIG. 8 is a perspective view of a conventional semiconductor device card, FIG. 9 is a cross-sectional view taken along the line IX—IX of FIG. 8, and FIG. 10 is a perspective view of the semiconductor device card before obverse and reverse panels described later are attached. A semiconductor device card 1 has a frame 4, a circuit board 2 supported inside the frame 4, and obverse and reverse panels 5a and 5b attached to the frame 4 on the obverse and reverse sides thereof to protect the circuit on the circuit board 2 by covering the two sides of the circuit board 2. The circuit board 2 is supported at its opposite ends on support portions 4a (see FIG. 9) of the frame 4 provided on opposite inner surfaces of the frame 4 and is fixed by caulking or the like (not shown). Electronic parts 3, e.g., semiconductor devices, are mounted on the two surfaces of the circuit board 2. Spacers 6 for preventing the obverse and reverse panels 5a and 5b from being depressed or bent inward by an external force are provided on the areas of the obverse and reverse surfaces of the circuit board 2 where no semiconductor devices or electronic parts 3 are mounted. Each spacer 6 is fixed to the obverse or reverse surface of the circuit board 2 with a spacer bonding sheet 7a such as an adhesive double faced tape. The frame 4 has fitting portions 4b formed along its inner edges so that the surfaces of the semiconductor device card 1 are flat when the panels are fitted on the fitting portions 4b. The panels 5a and 5b are fitted in recesses defined along the fitting portions 4b and are fixed on the outer surfaces of the fitting portions 4b by panel bonding sheets 7b. A plurality of external connection terminals 1a for electrically connecting the semiconductor devices in the semiconductor device card 1 to an external unit (not shown) are provided in one side surface of the frame 4. Details of internal electrical connection of the semiconductor device card 1 are not shown in the drawings and will not be described. External connection terminals other than these may be provided. For example, a plurality of terminals may be provided on an edge of one end of the obverse surface and a shutter may also be provided which can slide to cover and protect these terminals when these terminals are not used.

FIG. 11 is a cross-sectional view of another type of conventional semiconductor device card 1 in which obverse and reverse panels 5a and 5b are fixed on the frame 4 by being bonded to fitting portions 4b of frame 4 and upper surfaces of electronic parts 3 mounted on the circuit board 2 with panel bonding sheets 7b provided on the whole panel surfaces. Spacers 6 provided on the obverse and reverse sides of the circuit board are fixed by being bonded to predetermined positions on the obverse and reverse panels 5a and 5b with the panel bonding sheets 7b.

In the former conventional semiconductor device card, as described above, spacers provided in dead spaces on the circuit board are fixed by being bonded to the circuit board on the obverse and reverse panels with adhesive sheets or the like. This type of semiconductor device card therefore has a comparatively large number of parts and, hence, a comparatively large number of assembly steps, and requires a complicated manufacture process.

In the case of the card having spacers bonded and fixed to the panels by panel bonding sheets, there is the problem of undulations of the panel surfaces depending upon the thickness of the spacers and the condition of the panel bonding.

SUMMARY OF THE INVENTION

In view of these problems, an object of the present invention according to a first aspect of the invention is to provide a method of manufacturing a semiconductor device card in which the step of bonding spacers is eliminated to reduce the number of component parts and to simplify the assembly operation in the process of manufacturing the card.

Another object of the present invention according to a second aspect is to provide a semiconductor device card designed so as to reduce undulations of the surface of the obverse or reverse panel caused by bonding between spacers and the panel.

According to the first aspect of the present invention, there is provided a semiconductor device card manufacturing method wherein a spacer which fills a dead space on a portion of each of the major surfaces of the circuit board where no electronic parts are mounted is formed integrally with the frame.

According to the second aspect of the present invention, there is provided a semiconductor device card wherein a panel is fixed on the frame by being bonded to a spacer and an electronic part on the circuit board and to an inner peripheral edge portion of the frame with a bonding sheet, a recess being formed in the surface of the spacer bonded to the panel.

In the method according to the first aspect of the invention, the spacer is formed integrally with the frame to eliminate the need for the step of fixing the spacer on, the circuit board with a bonding sheet In the semiconductor device card according to the second aspect of the invention, a recess is formed in the surface of the spacer bonded to the obverse or reverse panel to reduce undulations in the panel surface.

The present invention also includes a method and a semiconductor device card based on the combination of these concepts of the invention.

BRIEF DESCRIPTION OF THE DRAWINGS

FIG. 7 is a perspective view of an embodiment of a frame of a semiconductor device card constructed by

Figure 8:
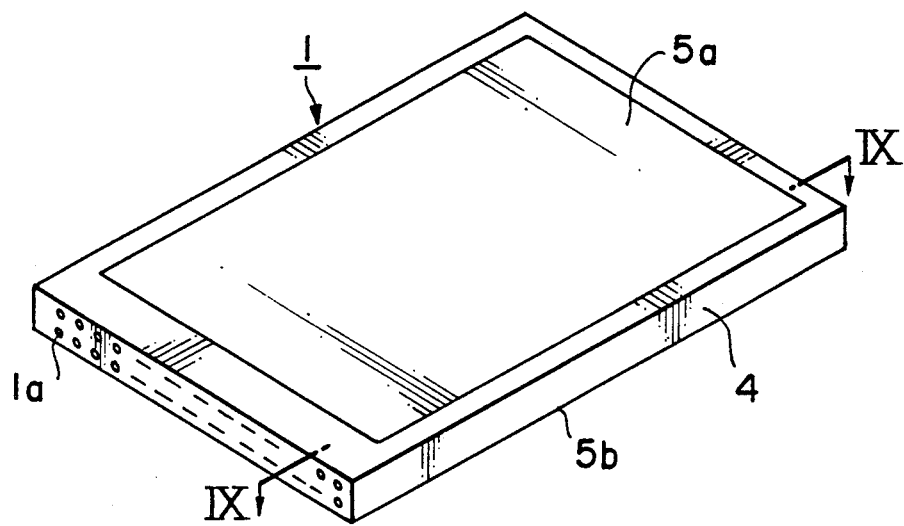
Figure 9:
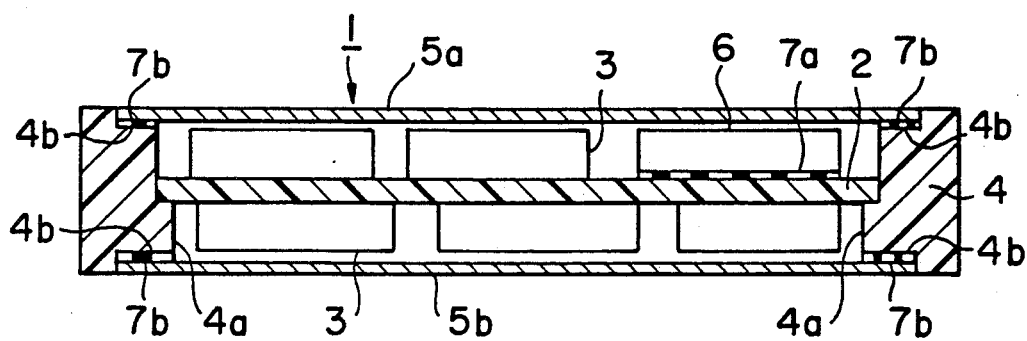
Figure 10:
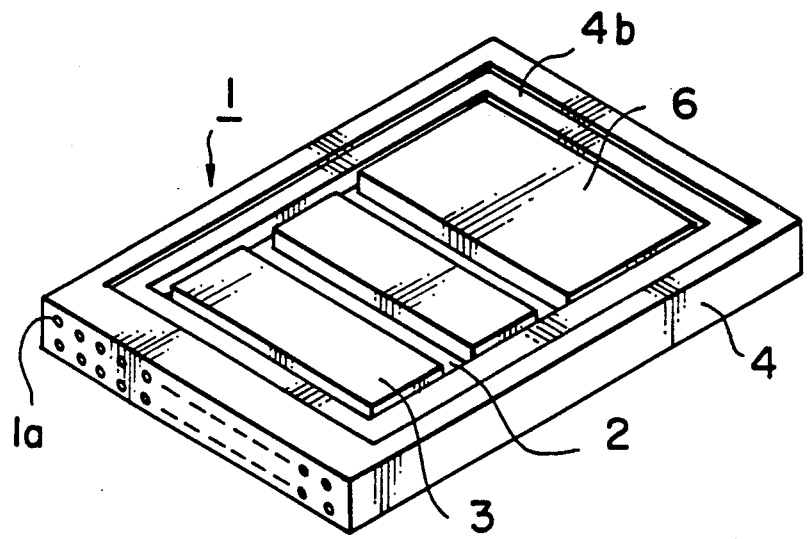
Figure 11:
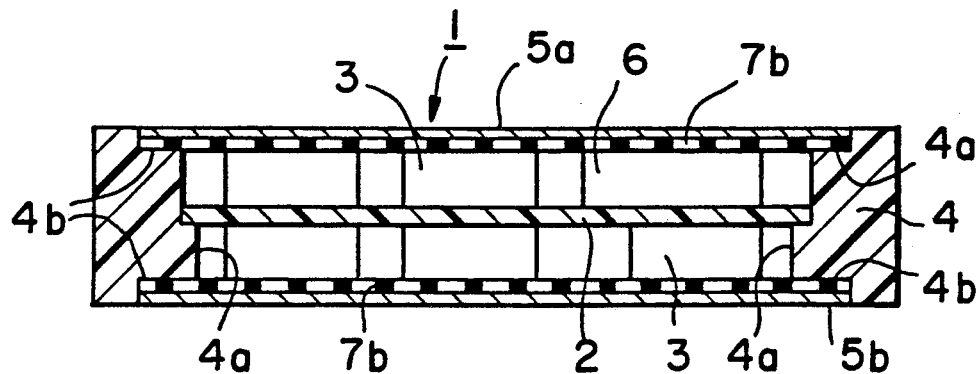

3 combining the first and second aspects of the present invention;

FIG. 8 is a perspective view of the appearance of a conventional semiconductor device card;

FIG. 9 is a cross-sectional view taken along the line IX—IX of FIG. 8;

FIG. 10 is a perspective view of the card of FIG. 8 before panels are attached; and FIG. 11 is a cross-sectional view of a conventional semiconductor device card in which spacers are bonded to the panels.

DESCRIPTION OF THE PREFERRED EMBODIMENTS

Figure 1:
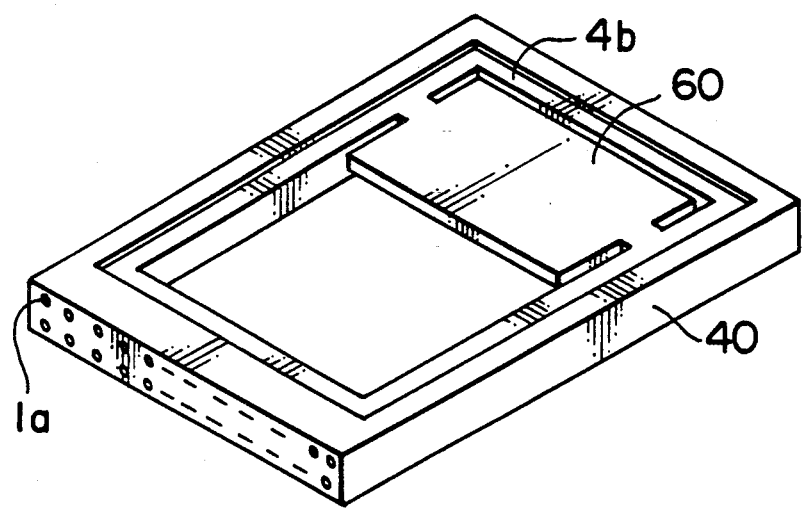
FIG. 1 is a perspective view of an embodiment of a frame of a semiconductor device card manufactured by a method in accordance with the first aspect of the present invention.
Figure 2:
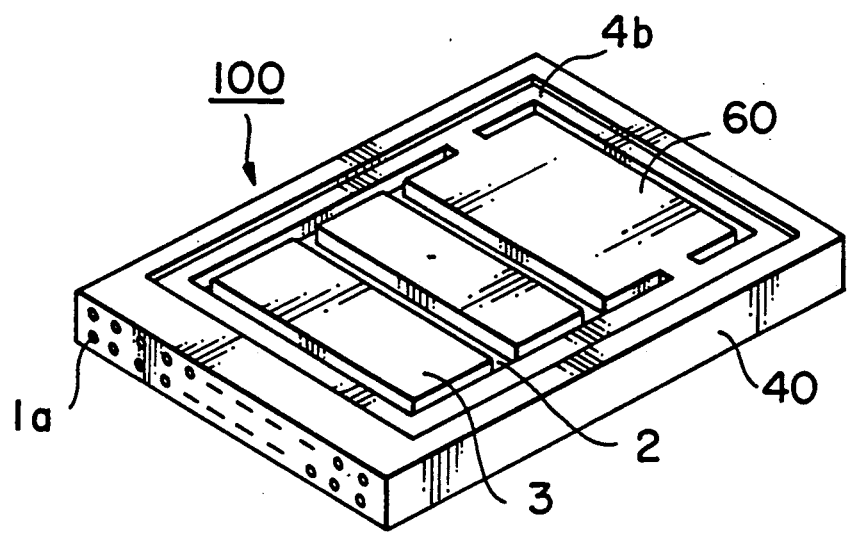
FIG. 2 is a perspective view of a semiconductor device card utilizing the frame of FIG. 1, before panels are attached.

Embodiments of the present invention will be described below with reference to the accompanying drawings. FIG. 1 shows in perspective an embodiment of a frame of a semiconductor device card manufactured by a method provided in the first aspect of the present invention, and FIG. 2 shows in perspective a semiconductor device card which uses the frame of FIG. 1 before panels are attached. In these figures, the same reference characters as those of FIGS. 9 and 10 indicate the same or corresponding components or portions. A spacer 60 is formed integrally with a frame 40 in correspondence with a dead space on a circuit board 2 where no electronic parts are mounted (see FIG. 2). This method of forming the spacer 60 integrally with the frame 40 or, in other words, forming the frame 40 including the spacer 60 eliminates the need for the operation of positioning the spacer and bonding the spacer on the circuit board with a bonding sheet or the like, and thus simplifies the assembly process. Also, the number of parts can be reduced since the spacer 60 is included in the frame 40. It is also possible to freely change the shape and the number of, spacers 60 according to the shape of the spaces on the circuit board and the parts mounting conditions.

Figure 3:
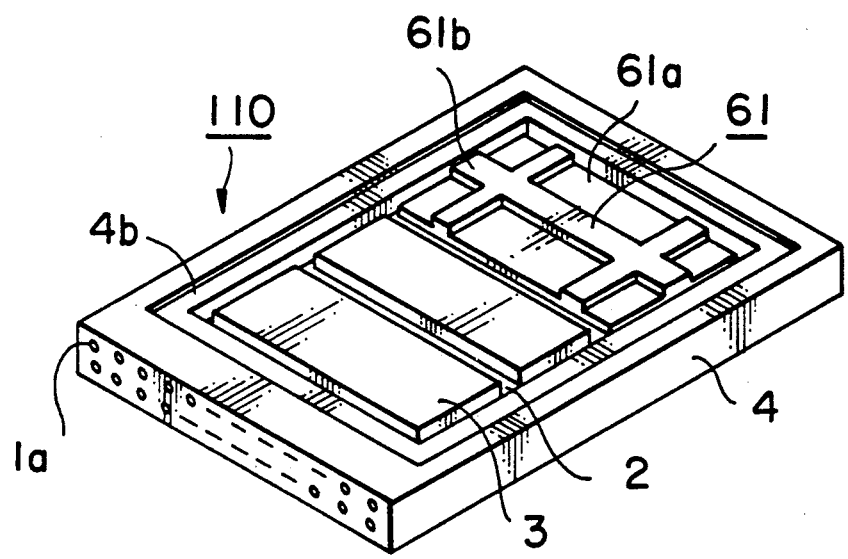
FIG. 3 is a perspective view of an embodiment of a semiconductor device card in accordance with the second aspect of the present invention, before panels are attached.
Figure 4:
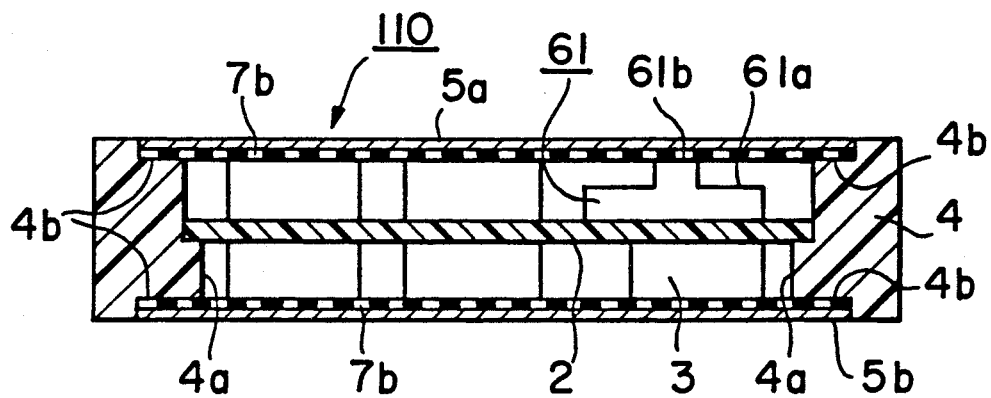
FIG. 4 is a cross-sectional view of the semiconductor device card of FIG. 3, with the panels attached.
Figure 5:
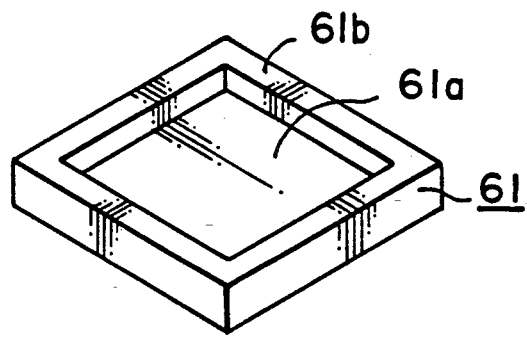
FIGS. 5 and 6 are perspective views of embodiments of spacers having recesses, which are used in the semiconductor device card in accordance with the second aspect of the present invention.
Figure 6:
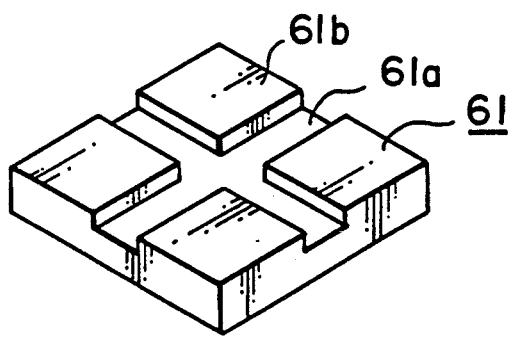

FIG. 3 shows a perspective view of a semiconductor device card in accordance with the second aspect of the present invention, showing the card before panels are attached, and FIG. 4 shows in section the semiconductor device card of FIG. 3 after the panels are attached. In these figures, the same reference characters as those of FIG. 11 indicate the same or corresponding components or portions. As shown in FIGS. 3 and 4, recesses 61a are formed on a spacer 61, and the area of a bonding surface 61b is smaller than in the conventional card. However, the upper surface of the spacer, i.e., the bonding surface 61b must have a shape and an area such as to support an obverse panel 5a or a reverse panel 5b against an external force applied from the outside of the card. The provision of the recesses 61a in the upper surface of the spacer 61 enables a reduction in undulations on the surface of the obverse panel 5a or reverse panel 5b depending upon the thickness of the bonding spacer 61 or the condition between the spacer 61 and the obverse panel 5a or reverse panel 5b. The shape of the upper surface of the spacer is not limited to that shown in FIG. 3. For example, it may alternatively be defined by forming recess 61a in a central portion of the spacer as shown in FIG. 5, or by forming recess 61a into a crisscross shape as shown in FIG. 6.

Figure 7:
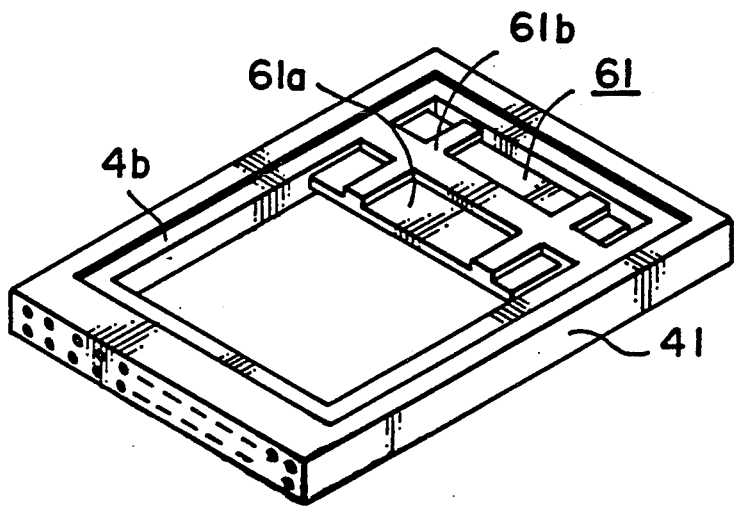

Further, a frame 41 may be used which is a combination of the features of the semiconductor device cards in accordance with the first and second aspects of the present invention, that may be, the frame 41 is formed integrally with a spacer 61 having recesses 61a formed in its upper surface as shown in FIG. 7. Obverse and reverse panels 5a and 5b may be attached to the frame 41 with panel bonding sheets 7b provided on the entire panel surfaces, as shown in FIG. 4. In this case, the panels 5a and 5b are bonded and fixed, by the panel bonding sheets 7b, to frame portions and components in the frame 41, i.e., fitting portions 4b of the frame 41, the upper surfaces of electronic parts 3 mounted on the circuit board 2, and the bonding surface 61b (see FIG. 7) of the spacer 61 formed integrally with the frame 41. The arrangement of the recesses 61a is not limited to that shown in FIG. 7, which defines the lattice-like shaped bonding surface 61b, and, for the same effect, recesses 61a such as those shown in FIGS. 5 and 6 may be used.

In the above-described semiconductor device cards according to the first and second aspects of the present invention, panels are provided on the obverse and reverse sides of the frame. However, the same effects of the invention can also be obtained when the invention is applied to a semiconductor device card in which peripheral side surfaces and one of the two surfaces of the circuit board are covered with a frame, and in which only one panel is attached to cover the other surface of the circuit board.

In the semiconductor device card according to the first aspect of the present invention, the spacer and the frame are formed integrally, and there is therefore no need to position the spacer in the vacant space on the circuit board and to fix the spacer with a bonding sheet or the like. Consequently, the number of component parts of the semiconductor device card can be reduced and the assembly process can be simplified. In the semiconductor device card according to the second aspect of the present invention, which is of the type characterized by bonding the spacer to the corresponding panel, a recess is formed on the portion of the spacer bonded to the obverse or reverse panel, thereby reducing undulations in the panel surface.

What is claimed is:

1. A method of manufacturing an IC card including a circuit board on which an electronic part is mounted, a frame on which the circuit board is mounted with edges of the circuit board supported by the frame, and a panel attached to the frame covering the circuit board comprising:

forming a frame having an integral spacer said spacer including a recess;

fixing a circuit board having a first portion occupied by electronic parts and a second portion not occupied by electronic parts in said frame with said integral spacer located at said second portion of the circuit board; and attaching a panel to the frame covering the circuit board and spacer and adjacent to and opposing the recess in the spacer.

2. A method according to claim 1 including attaching the panel by bonding the panel with a bonding sheet to the spacer, to the electronic parts mounted on the circuit board, and to the frame.

3. A semiconductor device card comprising:

a circuit board having major surfaces on obverse and reverse sides;

at least one electronic part mounted on one of the major surfaces of said circuit board;

a frame receiving and supporting said circuit board, said circuit board being supported on and fixed to said frame;

a panel attached to said frame covering one of the major surfaces of said circuit board, said panel having a surface;

at least one spacer filling an empty space at a position on a major surface of said circuit board where no electronic part is mounted, said spacer supporting said panel and including a recess adjacent and opposing said panel;

panel fixing means extending over the entire surface of said panel bonding said panel to said frame, to said spacer except at the recess, and to said electronic part on said circuit board; and electrical connection means for establishing an electrical connection between said electronic part and an external unit.

4. A semiconductor device card according to claim 3 wherein said spacer is integral with said frame.

5. A semiconductor device card according to claim 3 wherein said frame includes a fitting portion for attaching said panel to said frame flush with the electronic part and said spacer.

6. A semiconductor device card according to claim 5 wherein said panel fixing means includes a bonding sheet bonding the surface of said panel to said spacer, the electronic part, and the fitting portion of said frame.

7. A semiconductor device card according to claim 6 wherein said spacer is integral with said frame.

* * * * *